US012640351B2

(12) United States Patent　　(10) Patent No.:　US 12,640,351 B2

Tadaki et al.　　(45) Date of Patent:　May 26, 2026

(54) WAFER PLACEMENT TABLE

(71) Applicant: NGK Insulators, Ltd., Nagoya-City (JP)

(72) Inventors: Mikiya Tadaki, Chita-Gun (JP); Kazuhiro Nobori, Handa-City (JP); Takuya Yokono, Komaki-City (JP); Keita Yamana, Nagoya-City (JP); Reon Takanoya, Handa-City (JP); Atsuki Iriyama, Iwakura-City (JP)

(73) Assignee: NGK INSULATORS, LTD., Nagoya (JP)

( * ) Notice: Subject to any disclaimer, the term of this patent is extended or adjusted under 35 U.S.C. 154(b) by 765 days.

(21) Appl. No.: 18/062,249

(22) Filed: Dec. 6, 2022

(65) Prior Publication Data

US 2023/0187187 A1　　Jun. 15, 2023

(30) Foreign Application Priority Data

Dec. 13, 2021　　(JP) ................................. 2021-201834

(51) Int. Cl.
　　H01J 37/32　　　(2006.01)
　　H05B 3/03　　　(2006.01)
　　　　　(Continued)

(52) U.S. Cl.
　　CPC .......... H01J 37/32724 (2013.01); H05B 3/03 (2013.01); H05B 3/283 (2013.01); H10P 72/722 (2026.01)

(58) Field of Classification Search
　　CPC ..... H05B 3/283; H05B 3/03; H01J 37/32577; H01J 37/32724; H01L 21/6831;
　　　　　　(Continued)

(56) References Cited

U.S. PATENT DOCUMENTS 6,159,055 A　*　12/2000　Satitpunwaycha .... H01R 13/33
　　　　　　　　　　　　　　　　　　　439/700
11,476,096 B2 *　10/2022　Takahashi ......... H01L 21/67248
　　　　　　(Continued)

FOREIGN PATENT DOCUMENTS

JP　　　2003-163259 A　　　6/2003
JP　　　2012-069793 A　　　4/2012
　　　　　　(Continued)

OTHER PUBLICATIONS

Taiwanese Office Action dated Dec. 26, 2023 (Application No. 111147325).
　　　　　　(Continued)

*Primary Examiner* — Brian W Jennison
(74) *Attorney, Agent, or Firm* — BURR PATENT LAW, PLLC

(57)　　　　ABSTRACT

A wafer placement table includes a conductor unit. In the wafer placement table, a sub-RF electrode (first conductive layer) and a jumper layer (second conductive layer) are embedded at different levels in a ceramic substrate having a wafer placement surface, and the conductor unit establishes electrical continuity between the sub-RF electrode and the jumper layer. The conductor unit is a transversely placed coil or a transversely placed perforated cylindrical body.

6 Claims, 12 Drawing Sheets

(51) Int. Cl.
　　*H05B 3/28*　　　　(2006.01)
　　*H10P 72/72*　　　(2026.01)

(58) Field of Classification Search
　　CPC ............... H01L 21/683; H01L 21/6833; H01L
　　　　　　　　　21/68785; H01L 21/68757
　　See application file for complete search history.

(56)　　　　　　　References Cited

U.S. PATENT DOCUMENTS

| | | | |
|---|---|---|---|
| 2006/0102595 A1* | 5/2006 | Inoue ................ | H01L 21/68785 |
| | | | 219/50 |
| 2019/0355556 A1* | 11/2019 | Takahashi ......... | H01J 37/32724 |
| 2020/0219755 A1* | 7/2020 | Akatsuka ............ | H01L 21/6831 |
| 2021/0298127 A1* | 9/2021 | Kawanabe ............. | H05B 3/283 |
| 2022/0394822 A1* | 12/2022 | Kawanabe .......... | H01L 21/6833 |

FOREIGN PATENT DOCUMENTS

| | | |
|---|---|---|
| JP | 2021-022502 A | 2/2021 |
| TW | 201923952 A | 6/2019 |

OTHER PUBLICATIONS

Korean Office Action (with English translation) dated Oct. 14, 2024
(Application No. 10-2022-0169519).

\* cited by examiner

Fig. 14A
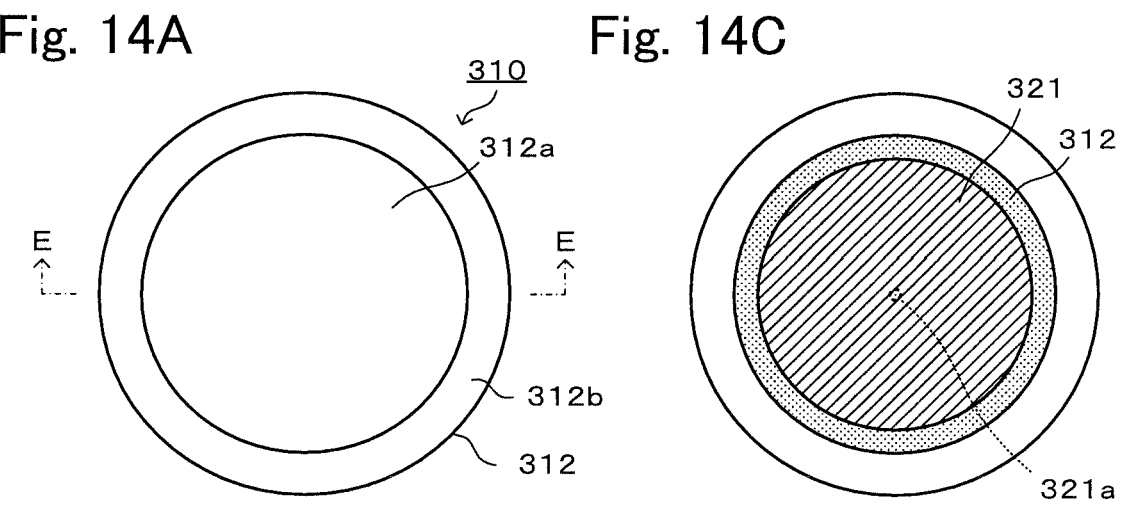
Fig. 14B
Fig. 14C
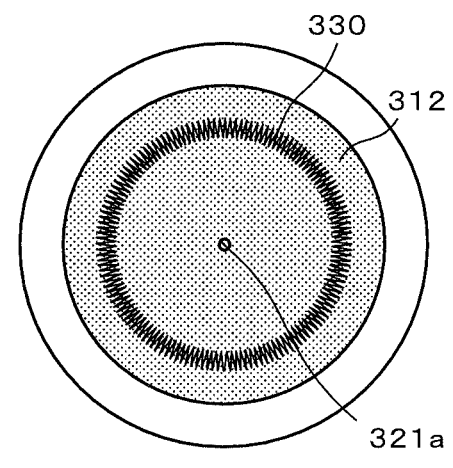
Fig. 14D
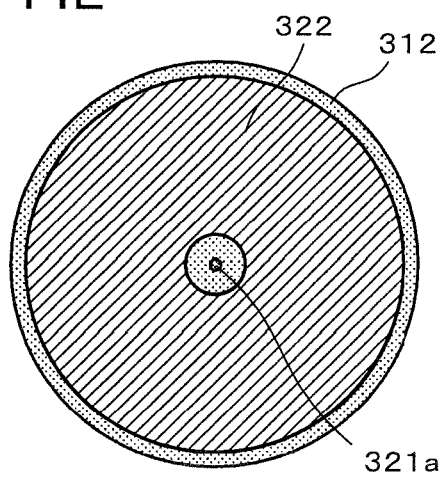
Fig. 14E

Fig. 15A
Fig. 15C
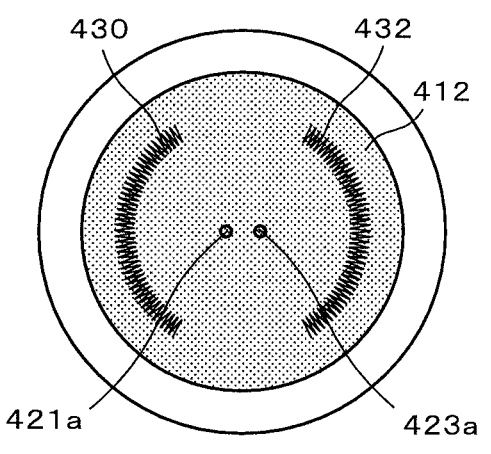
Fig. 15B
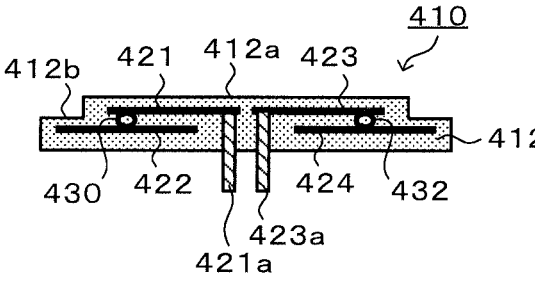
Fig. 15D
Fig. 15E
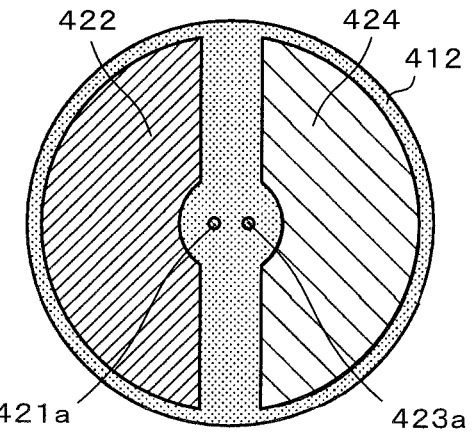

Fig. 16A
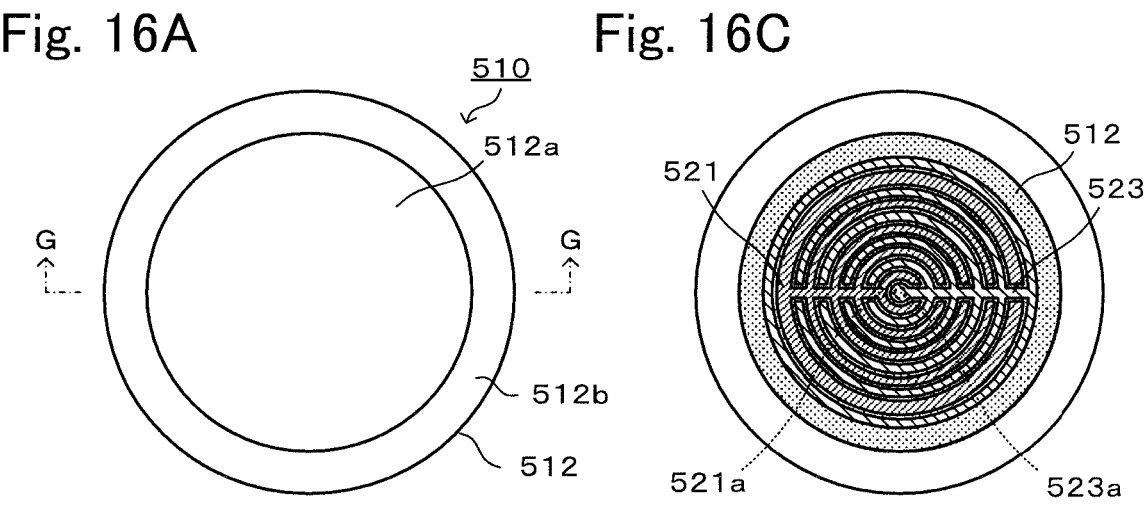
Fig. 16C
Fig. 16B
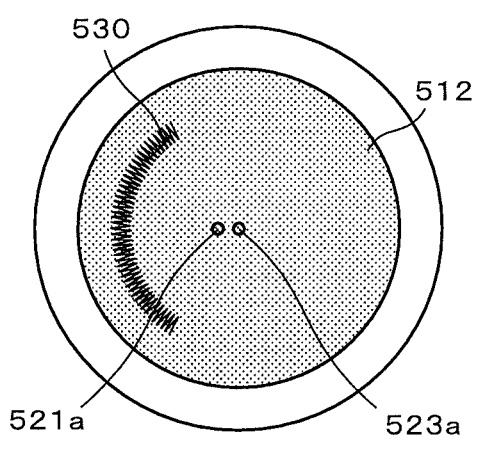
Fig. 16D
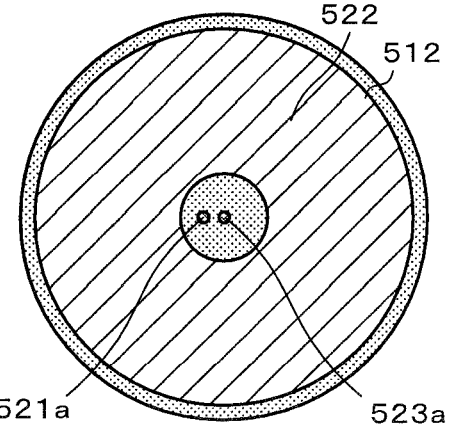
Fig. 16E

Fig. 17A
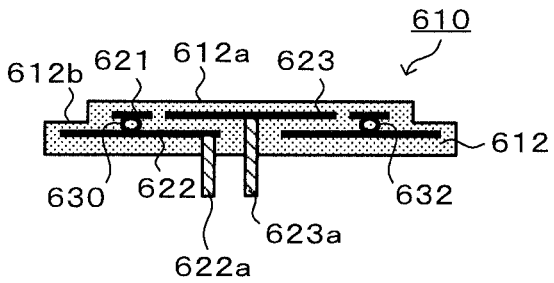
Fig. 17C
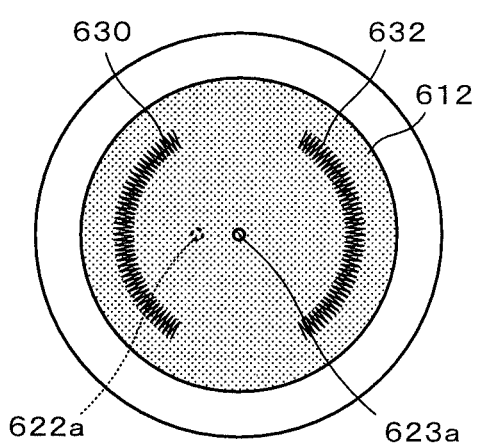
Fig. 17B
Fig. 17D
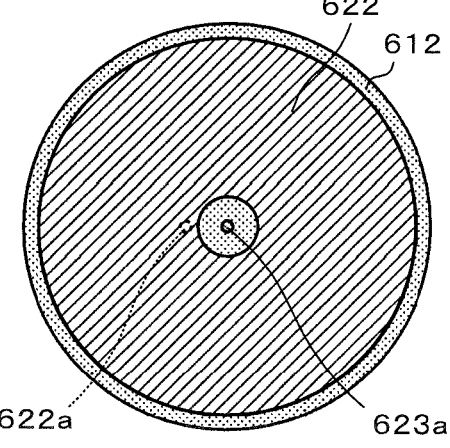
Fig. 17E

WAFER PLACEMENT TABLE

BACKGROUND OF THE INVENTION

1. Field of the Invention

The present invention relates to a wafer placement table.

2. Description of the Related Art

A wafer placement table of related art used for processing a wafer has been known. Examples of the wafer placement table include a ceramic heater, an electrostatic chuck, a susceptor (an apparatus that includes therein electrodes for generating plasma), and the like. For example, PTL 1 discloses, as such a wafer placement table, an apparatus in which a disc-shaped first electrode and a ring-shaped second electrode having a larger diameter than that of the first electrode are embedded in a ceramic substrate having a wafer placement surface so as to be parallel to a wafer placement surface. The first electrode and the second electrode in this order are arranged in increasing order of the distance from the wafer placement surface. There is electrical continuity between the first electrode and the second electrode through a conductor unit. PTL 1 discloses an example in which a metal mesh bent in a zigzag pattern is used as the conductor unit, an example in which a coil is vertically placed as the conductor unit, and the like.

CITATION LIST

Patent Literature

PTL 1: Japanese Unexamined Patent Application Publication No. 2003-163259

SUMMARY OF THE INVENTION

However, in the case where the metal mesh bent in a zigzag pattern or the vertically placed coil is used as the conductor unit, a conductive path of the conductor unit becomes considerably greater than the distance between the first electrode and the second electrode. This may increase the likelihood of generating heat in the conductor unit, producing adverse effects on thermal uniformity of the wafer.

The present invention is made to address such a problem, and a main object of the present invention is to improve thermal uniformity of a wafer in a wafer placement table in which a conductor unit establishes electrical continuity between a first conductive layer and a second conductive layer disposed at different levels.

A wafer placement table according to the present invention includes a conductor unit. In the wafer placement table, a first conductive layer and a second conductive layer are embedded at different levels in a ceramic substrate having a wafer placement surface, and the conductor unit establishes electrical continuity between the first conductive layer and the second conductive layer.

The conductor unit is a transversely placed coil or a transversely placed perforated cylindrical hollow body.

In this wafer placement table, the conductor unit is a transversely placed coil or a transversely placed perforated cylindrical body. Accordingly, a conductive path of the conductor unit is closer to the distance between the first conductive layer and the second conductive layer than that in the case where the metal mesh bent in a zigzag pattern or the vertically placed coil is used as the conductor unit. Accordingly, heat generation at the conductor unit can be suppressed, which in turn can improve thermal uniformity of the wafer. Examples of the perforated cylindrical body include, for example, a punching-metal cylindrical body, a metal-mesh cylindrical body, and the like.

In the wafer placement table according to the present invention, a material of the ceramic substrate may be contained in an inner space of the conductor unit. Thus, the variation of the density of the ceramic substrate reduces, and the strength of the ceramic substrate increases.

In the wafer placement table according to the present invention, a sectional shape of the conductor unit may be a circle or an oval. Thus, even when forces in the compressing direction are applied to the conductor unit from above and below in the manufacturing process, the conductor unit can absorb the forces.

In the wafer placement table according to the present invention, the conductor unit may be the coil, at least one of the first conductive layer or the second conductive layer may have a hole that penetrates therethrough in a thickness direction, and the coil may be inserted through the hole so as to allow an inner surface of the hole and a side surface of the coil to be in contact with each other. Thus, compared to a case where the coil is in point contact with each of the conductive layers, the contact area increases, and accordingly, the likelihood of ensuring electrical continuity increases.

In the wafer placement table according to the present invention, the second conductive layer may be a linear conductive layer or a rectangular conductive layer that intersects the first conductive layer in plan view, and an axis of the conductor unit may straightly extend in a direction in which the second conductive layer extends. Thus, the length of the conductor unit can be comparatively increased, and the likelihood of ensuring electrical continuity between the first conductive layer and the second conductive layer increases.

In the wafer placement table according to the present invention, the second conductive layer may be an annular conductive layer or a sector-shaped conductive layer that overlaps the first conductive layer in plan view. The axis of the conductor unit may extend along an arc that is concentric with the second conductive layer. Thus, the length of the conductor unit can be comparatively increased, and the likelihood of ensuring electrical continuity between the first conductive layer and the second conductive layer increases.

BRIEF DESCRIPTION OF THE DRAWINGS

FIGS. 14A to 14E are explanatory views of a wafer placement table 310.

FIGS. 15A to 15E are explanatory views of a wafer placement table 410.

FIGS. 16A to 16E are explanatory views of a wafer placement table 510.

FIGS. 17A to 17E are explanatory views of a wafer placement table 610.

DETAILED DESCRIPTION OF THE INVENTION

First Embodiment

Figure 1:
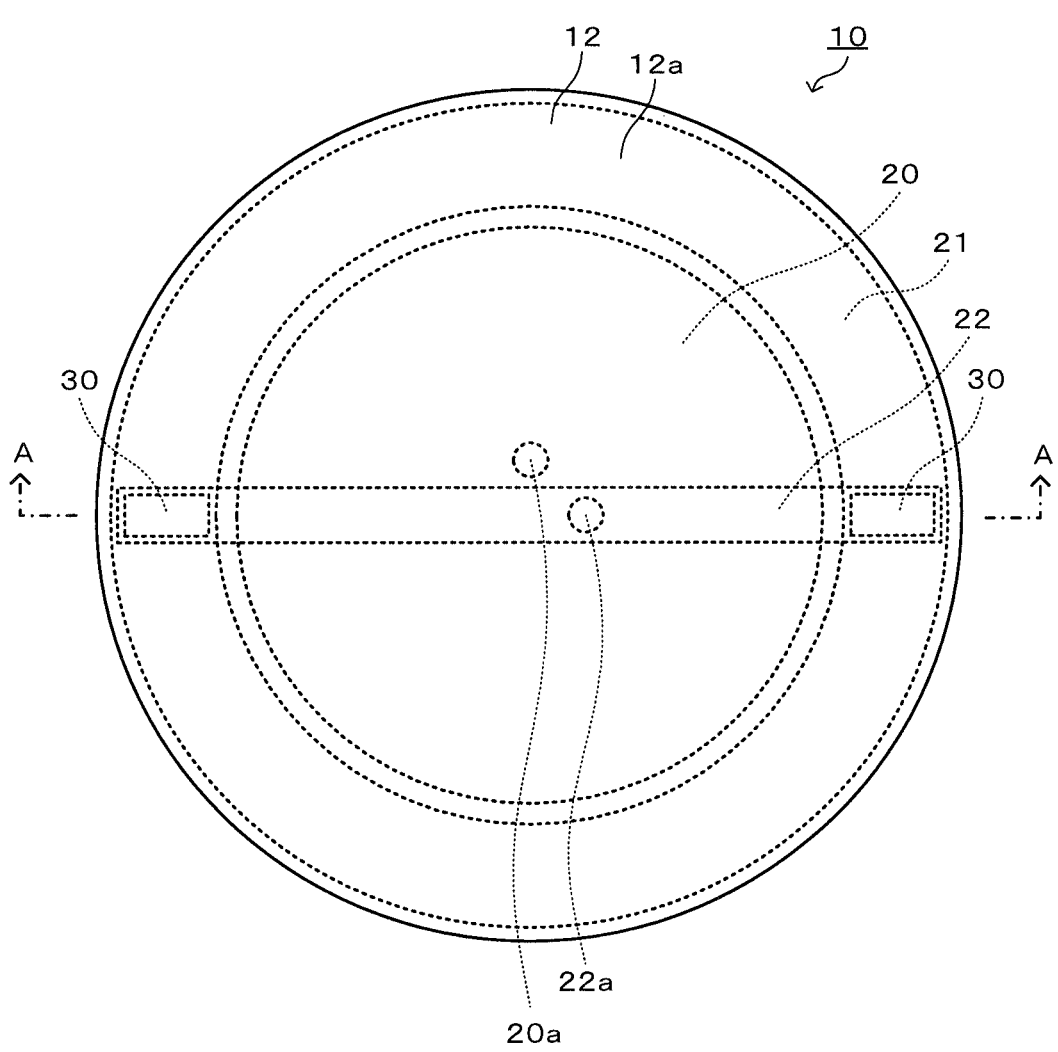
FIG. 1 is a plan view of a wafer placement table 10.
Figure 2:
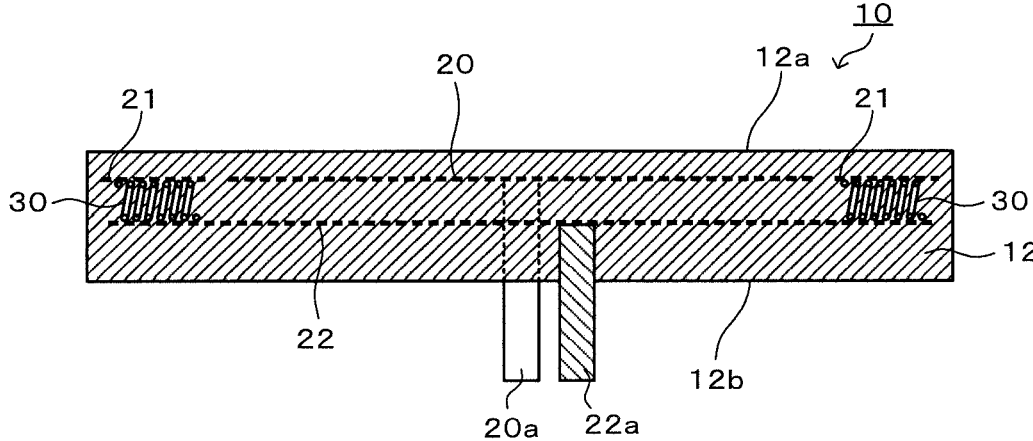
FIG. 2 is a sectional view taken along line A-A illustrated in FIG. 1.
Figure 3:
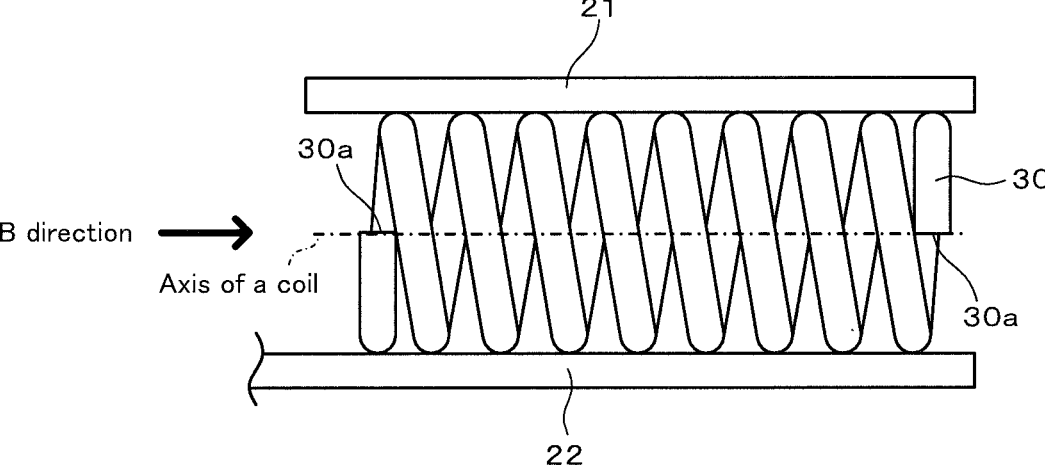
FIG. 3 is a side view of a conductor unit 30 and a region around the conductor unit 30.
Figure 4:
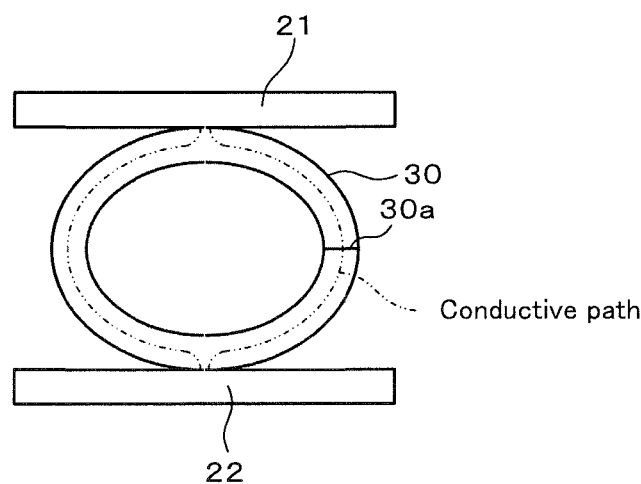
FIG. 4 is a diagram seen in a B direction illustrated in FIG. 3.

A first embodiment of the present invention is described below with reference to the drawings. FIG. 1 is a plan view of a wafer placement table 10. FIG. 2 is a sectional view taken along line A-A illustrated in FIG. 1. FIG. 3 is a side view of a conductor unit 30 and a region around the conductor unit 30. FIG. 4 is a diagram seen in a B direction illustrated in FIG. 3. Herein, "upper" or "lower" does not represent an absolute positional relationship. The "upper" and "lower" represent relative positional relationships. Accordingly, "upper" and "lower" may represent "upper" and "lower", "left" and "right", or "front" and "rear" depending on the orientation of the wafer placement table 10.

The wafer placement table 10 is used to perform chemical vapor deposition (CVD), etching, or the like on a wafer by utilizing plasma and disposed in a chamber (not illustrated) for semiconductor processing. The wafer placement table 10 includes a main RF electrode 20, a sub-RF electrode 21, a jumper layer 22, and conductor units 30 disposed in a ceramic substrate 12.

The ceramic substrate 12 is a disc-shaped plate formed of a ceramic material typical examples of which include aluminum nitride, silicon carbide, silicon nitride, aluminum oxide, and so forth. The ceramic substrate 12 includes a circular wafer placement surface 12a and a rear surface 12b disposed on the opposite side of the ceramic substrate 12 to the wafer placement surface 12a. The circular main RF electrode 20 and the annular sub-RF electrode 21 are provided in the same plane in the ceramic substrate 12 so as to be concentric with each other. The rectangular jumper layer 22 is provided in a different plane from the plane in which the main RF electrode 20 and the sub-RF electrode 21 are provided in the ceramic substrate 12. A plurality of irregularities (not illustrated) are formed by embossing in the wafer placement surface 12a. A gas for thermal conduction (for example, an He gas) is supplied, through a gas supply path (not illustrated), from the rear surface 12b side to spaces between recessed portions provided in the wafer placement surface 12a and the wafer placed on the wafer placement surface 12a.

The main RF electrode 20 is a disc electrode that is concentric with the ceramic substrate 12 and provided such that the main RF electrode 20 faces the wafer placement surface 12a and is parallel to the wafer placement surface 12a. The term "parallel" means, in addition to a case of exactly being parallel, a case of being parallel within an allowable range (for example, a tolerance) (hereinafter, this is similarly applicable). The main RF electrode 20 is an electrode the main component of which is Mo, Nb, W, or Ta, a carbide of one of Mo, Nb, W, and Ta, or a high melting composite metal that includes two or more of Mo, Nb, W, and Ta. The main RF electrode 20 is formed of a metal mesh, a punching metal, or a metal plate. The term "main component" means a component of a highest percentage content out of the components (hereinafter, this is similarly applicable). An RF voltage is applied between the main RF electrode 20 and an upper electrode (a shower head 90, which will be described later) in generating plasma in a space above a central region of the wafer placed on the wafer placement surface 12a. The main RF electrode 20 is connected to a power supply rod 20a inserted into the rear surface 12b of the ceramic substrate 12. The power supply rod 20a is disposed so as not to be brought into contact with the jumper layer 22.

The sub-RF electrode 21 is an annular electrode that has a larger outer diameter than that of the main RF electrode 20 and that is concentric with the ceramic substrate 12. A gap is provided between an inner peripheral edge of the sub-RF electrode 21 and an outer peripheral edge of the main RF electrode 20. The sub-RF electrode 21 is formed of a metal mesh, a punching metal, or a metal plate the material of which is the same as that of the main RF electrode 20. An RF voltage is applied between the sub-RF electrode 21 and the upper electrode (the shower head 90, which will be described later) in generating plasma in a space above an outer peripheral region of the wafer placed on the wafer placement surface 12a.

The jumper layer 22 is a rectangular planar conductive layer extending in a diameter direction of the ceramic substrate 12. The jumper layer 22 is formed of a metal mesh, a punching metal, or a metal plate the material of which is the same as that of the main RF electrode 20. The jumper layer 22 is connected to a power supply rod 22a inserted into the rear surface 12b of the ceramic substrate 12.

The conductor units 30 are members that electrically connect the sub-RF electrode 21 and the jumper layer 22 to each other. The conductor units 30 are provided at two positions where the sub-RF electrode 21 and the jumper layer 22 overlap each other in plan view. Each conductor unit 30 is a transversely placed coil. The term "transversely placed coil" means that the axis of the coil is directed in the horizontal direction (hereinafter, this is similarly applicable). The term "horizontal" means, in addition to a case of being exactly horizontal, a case of being horizontal within an allowable range (for example, a tolerance) (hereinafter, this is similarly applicable). In the conductor unit 30, the axis of the coil straightly provided in a direction in which the jumper layer 22 extends (the diameter direction of the ceramic substrate 12 herein). The coil is formed of a material the main component of which is Mo, Nb, W, or Ta, a carbide of one of Mo, Nb, W, and Ta, or a high melting composite metal that includes two or more of Mo, Nb, W, and Ta. The coil may be formed of the same material as that of the main RF electrode 20 or a different material from that of the main RF electrode 20. It is preferable that the wire diameter of the coil be smaller than or equal to 0.6 mm. The coil has an oval shape as illustrated in FIG. 4. The short diameter of the coil is coincident with the distance between the sub-RF electrode 21 and the jumper layer 22. Terminating portions 30a of the coil included in the conductor unit 30 are disposed inside the outer diameter of the coil (see FIG. 4).

Next, an example of the manufacture of the wafer placement table 10 is described with reference to FIGS. 5A to 5F. FIGS. 5A to 5F are explanatory views illustrating a manufacturing process of the wafer placement table 10.

Figures 5A, 5B, 5C, 5D, 5E, 5F:
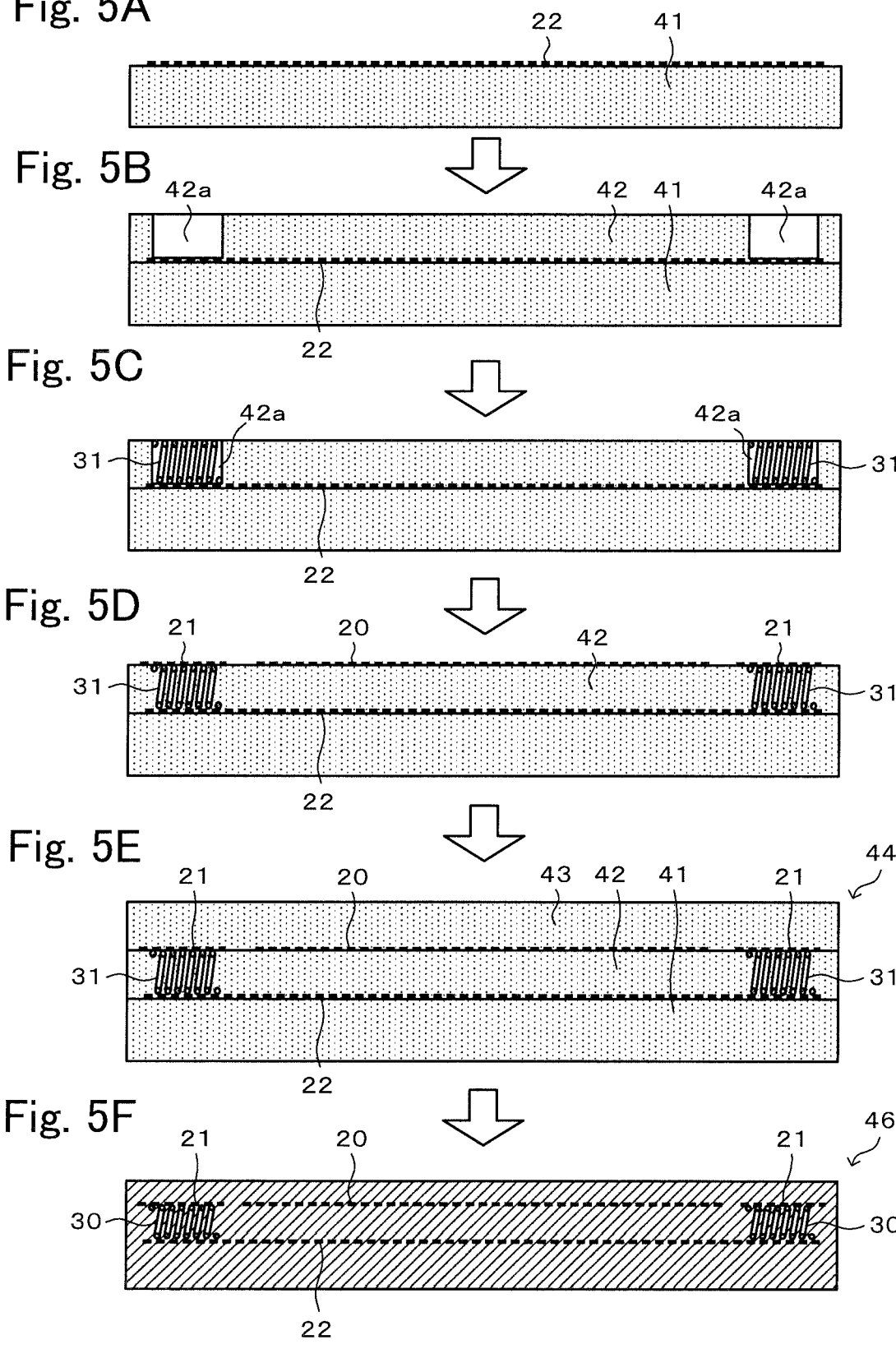
FIGS. 5A to 5F are explanatory views illustrating a manufacturing process of the wafer placement table 10.

First, a disc-shaped first ceramic molded body 41 is fabricated from ceramic powder having an average particle diameter of a several to several tens of µm, and the jumper layer 22 is formed on one of the surfaces of the first ceramic molded body 41 (see FIG. 5A). The first ceramic molded body 41 can be obtained by using, for example, a tape forming process. In a case of forming the jumper layer 22, a metal mesh or the like may be placed on the upper surface of the first ceramic molded body 41, or conductive paste that is to serve as the jumper layer 22 may be printed on the upper surface of the first ceramic molded body 41.

Next, a second ceramic molded body 42 that has been fabricated in a similar manner to that of the first ceramic molded body 41 is placed on the surface of the first ceramic molded body 41 where the jumper layer 22 has been formed so as to be integrated with the first ceramic molded body 41. After that, holes 42a are formed so as to reach the jumper layer 22 by using a drill at positions of the second ceramic molded body 42 where the conductor units 30 are to be provided (see FIG. 5B).

Next, coils 31 having a circular shape or an oval shape are transversely placed in the holes 42a (see FIG. 5C). Then, the gaps of the coils 31 are filled with the ceramic powder, and the main RF electrode 20 and the sub-RF electrode 21 are formed on an upper surface of the second ceramic molded body 42 (see FIG. 5D).

Next, a third ceramic molded body 43 that has been fabricated in a similar manner to that of the first ceramic molded body 41 is placed on the upper surface of the second ceramic molded body 42 so as to be integrated with the second ceramic molded body 42, thereby to obtain a layered body 44 (see FIG. 5E).

Next, the layered body 44 is subjected to hot-press sintering to cause the ceramic powder included in the layered body 44 to undergo sintering, and a disc-shaped ceramic substrate 46 is obtained (see FIG. 5F). Since the transversely placed coils 31 are compressed in the vertical direction during the hot-press firing, the coils 31 are deformed to an oval shape and the conductor units 30 are obtained. Since the conductor units 30 are coils having been compressed to have the oval shape as described above, the conductor units 30 are firmly in contact with the sub-RF electrode 21 and the jumper layer 22. After then, the outer shape of the disc-shaped ceramic substrate 46 is processed, holes into which the power supply rods 20a and 22a are inserted are formed, and the power supply rods 20a and 22a are respectively joined to the main RF electrode 20 and the jumper layer 22. In this way, the wafer placement table 10 including the ceramic substrate 12 is obtained.

Figure 6:
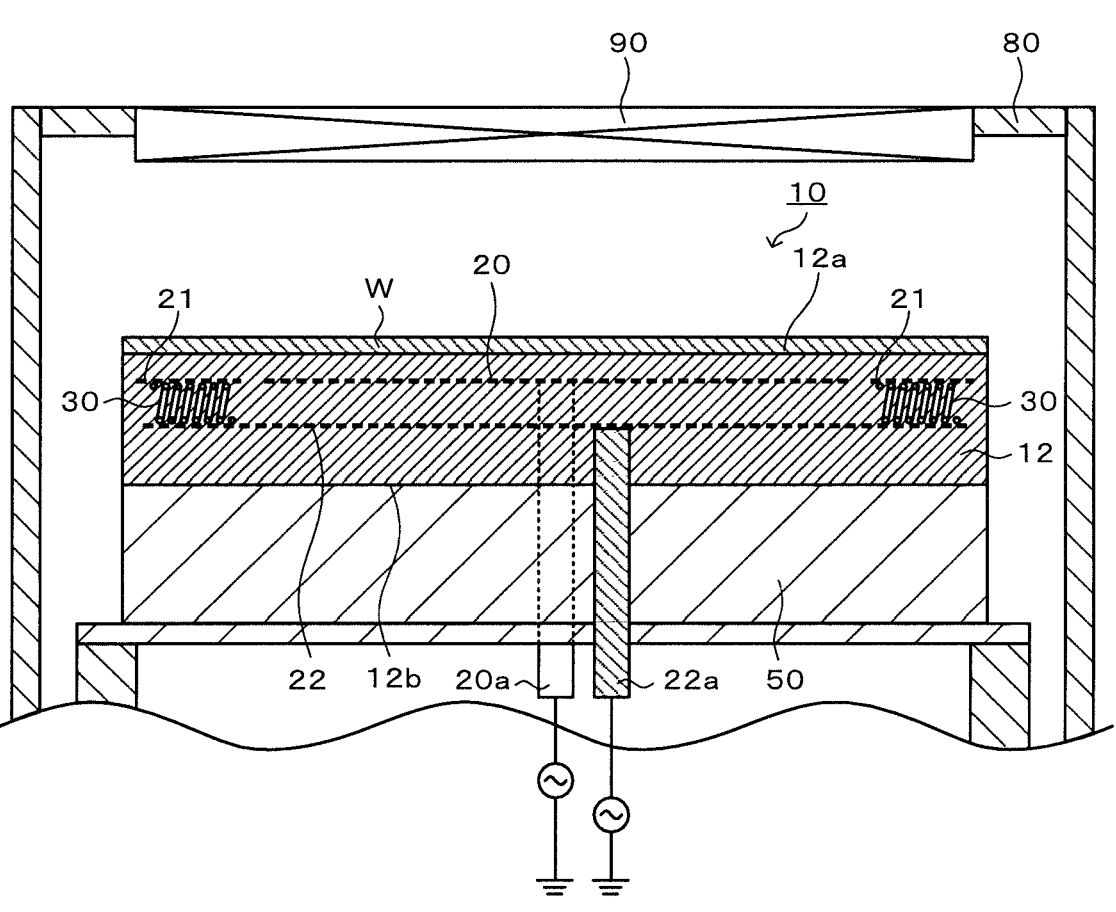
FIG. 6 is an explanatory view of an example of usage of the wafer placement table 10.

Next, an example of usage of the wafer placement table 10 is described with reference to FIG. 6. FIG. 6 is an explanatory view of the example of usage of the wafer placement table 10.

The wafer placement table 10 is installed in a chamber 80 after a metal cooling plate 50 has been attached to the rear surface 12b of the ceramic substrate 12. The power supply rods 20a and 22a are electrically insulated from the cooling plate 50. The shower head 90 is installed at a position in the chamber 80 facing the wafer placement table 10. A disc-shaped wafer W is placed on the wafer placement surface 12a of the wafer placement table 10. In this state, the inside of the chamber 80 is set to a predetermined vacuum atmosphere (or a predetermined reduced pressure atmosphere), and plasma is generated in a space above the wafer W while a process gas is being supplied from the shower head 90. Specifically, the plasma is generated by supplying high-frequency power to the main RF electrode 20 through the power supply rod 20a and supplying high-frequency power to the sub-RF electrode 21 independently of the main RF electrode 20 through the power supply rod 22a, the jumper layer 22, and the conductor units 30. Different types of high-frequency power (for example, different wattages at the same frequency, the same wattage at different frequencies, different wattages at different frequencies, or the like) can be supplied to the main RF electrode 20 and the sub-RF electrode 21, respectively. Thus, the density of the plasma above the wafer W placed on the wafer placement surface 12a can be equalized. The plasma is utilized to perform CVD film formation or etching on the wafer W. The temperature of the wafer W can be controlled by adjusting the temperature of a coolant supplied to a coolant path (not illustrated) of the cooling plate 50 attached to the rear surface of the wafer placement table 10.

Here, correspondences between the elements of the present embodiment and the elements of the present invention are clarified. The ceramic substrate 12, the sub-RF electrode 21, the jumper layer 22, and the conductor unit 30 according to the present embodiment respectively correspond to a ceramic substrate, a first conductive layer, a second conductive layer, and a conductor unit according to the present invention.

In the wafer placement table 10 described above, each conductor unit 30 is a transversely placed coil. Accordingly, a conductive path of the conductor unit 30 is closer to the distance between the sub-RF electrode 21 and the jumper layer 22 than in a case where a metal mesh bent in a zigzag pattern or a vertically placed coil is used as the conductor unit. Specifically, the conductive path of the conductor unit 30 is a substantially oval path (see two-dot chain line illustrated in FIG. 4). Accordingly, heat generation at the conductor unit 30 can be suppressed, which in turn can improve thermal uniformity of the wafer.

Furthermore, the same ceramic material as that of the ceramic substrate 12 has entered and is contained in an inner space of the coil included in the conductor unit 30. Thus, the variation of the density of the ceramic substrate 12 reduces, and the strength of the ceramic substrate 12 increases.

Furthermore, the coil included in the conductor unit 30 is an oval coil. When forces in the compressing direction are applied to a transversely placed circular or oval coil from above and below in the manufacturing process, the coil absorbs the force and becomes oval.

Furthermore, the jumper layer 22 is a rectangular conductive layer that intersects the sub-RF electrode 21 in plan view. The axis of the coil included in the conductor unit 30 straightly extends in a direction in which the jumper layer 22 extends. Accordingly, the length of the transversely placed coil can be comparatively increased, and the likelihood of ensuring electrical continuity between the sub-RF electrode 21 and the jumper layer 22 increases.

Second Embodiment

Figure 7:
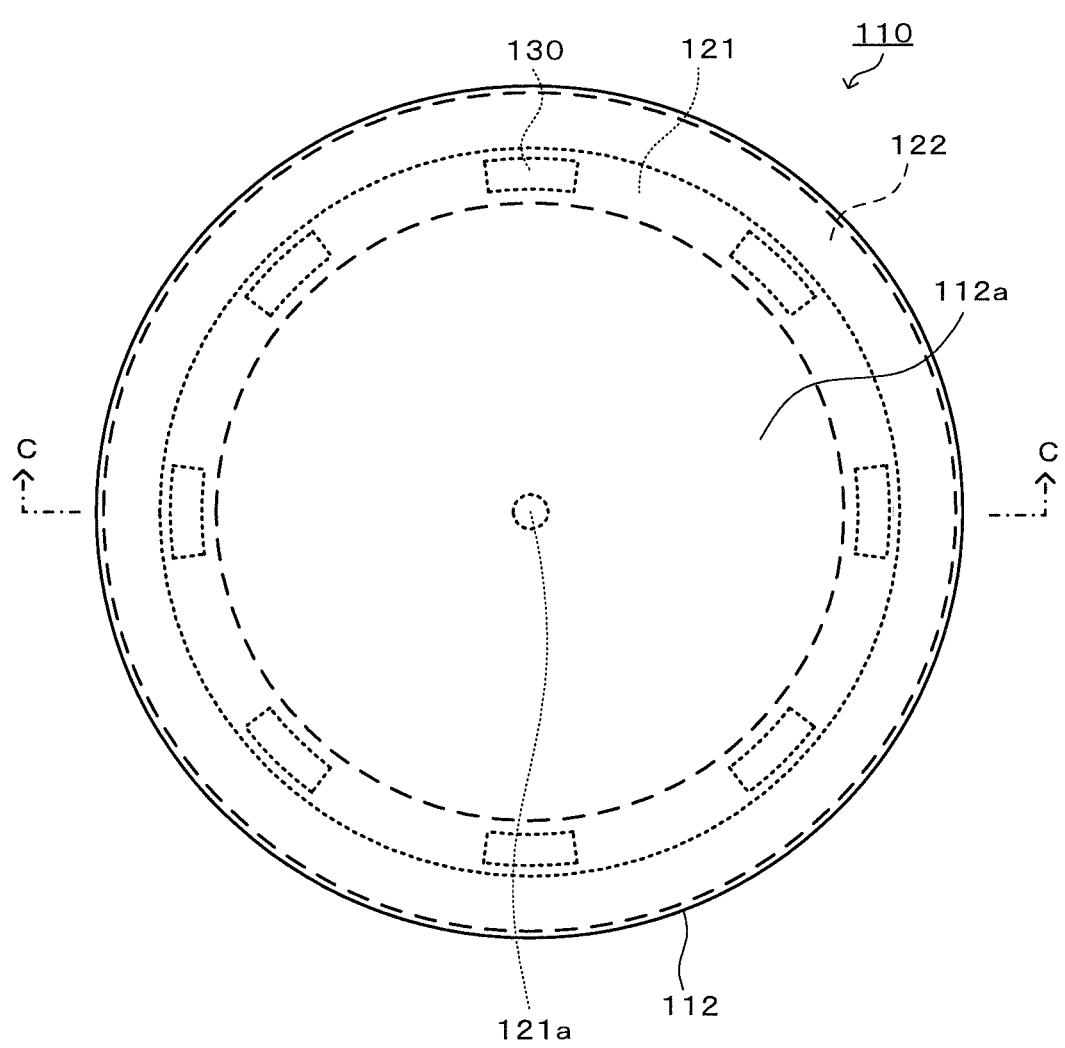
FIG. 7 is a plan view of a wafer placement table 110.
Figure 8:
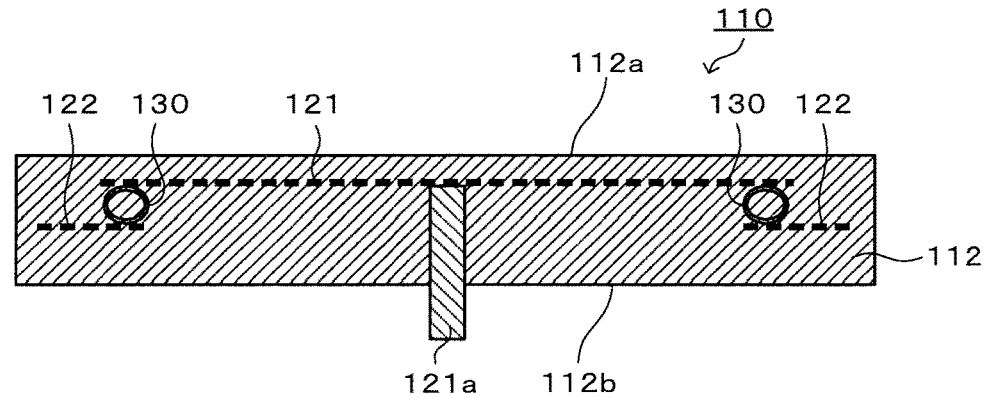
FIG. 8 is a sectional view taken along line C-C illustrated in FIG. 7.
Figure 9:
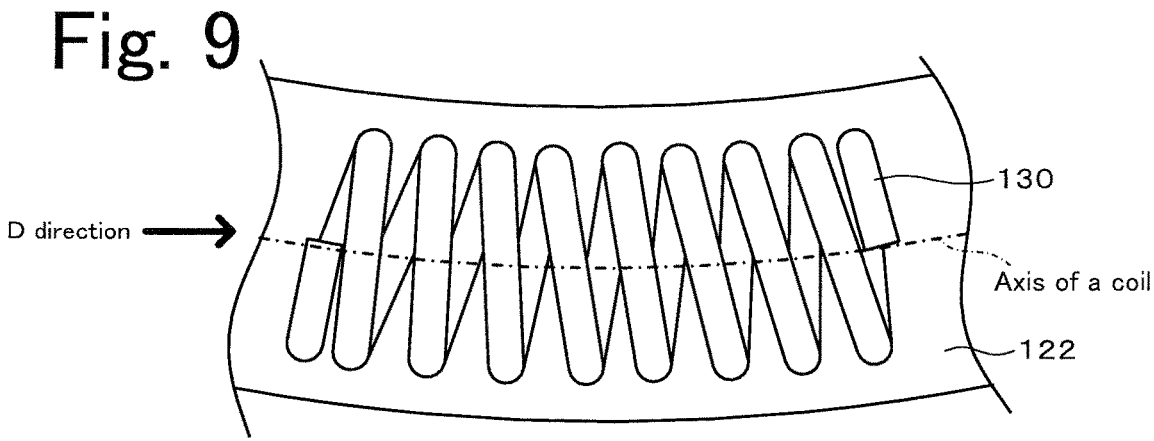
FIG. 9 is a plan view of a conductor unit 130 and a region around the conductor unit 130.
Figure 10:
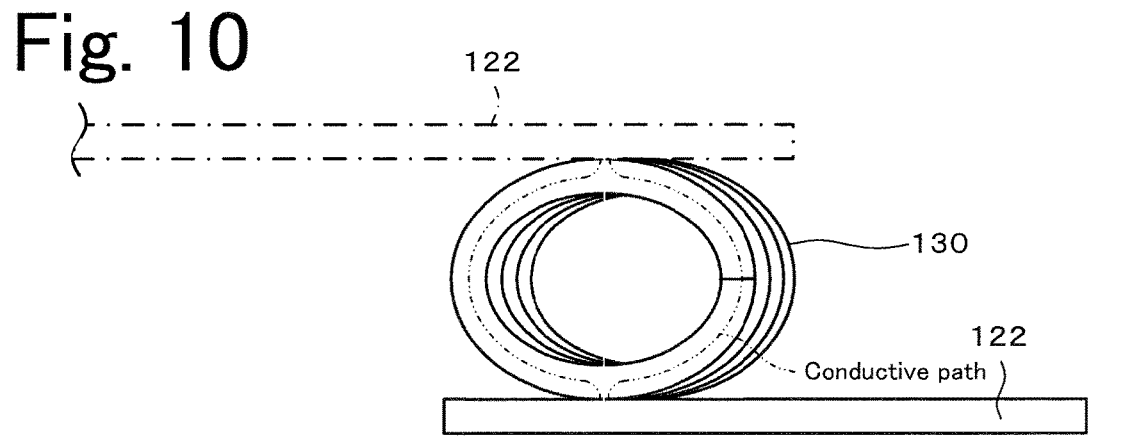
FIG. 10 is a diagram seen in a D direction illustrated in FIG. 9.

A second embodiment of the present invention is described below with reference to the drawings. FIG. 7 is a plan view of a wafer placement table 110. FIG. 8 is a sectional view taken along line C-C illustrated in FIG. 7. FIG. 9 is a plan view of a conductor unit 130 and a region around the conductor unit 130. FIG. 10 is a diagram seen in a D direction illustrated in FIG. 9.

The wafer placement table 110 is used to perform CVD, etching, or the like on a wafer by utilizing plasma and disposed in a chamber (not illustrated) for semiconductor processing. The wafer placement table 110 includes a first RF electrode 121, a second RF electrode 122, and conductor units 130 disposed in a ceramic substrate 112.

The ceramic substrate 112 is a disc-shaped plate formed of a ceramic material typical examples of which include aluminum nitride, silicon carbide, silicon nitride, aluminum oxide, and so forth. The ceramic substrate 112 includes a circular wafer placement surface 112a and a rear surface 112b disposed on the opposite side of the ceramic substrate 112 to the wafer placement surface 112a. The first RF electrode 121 and the second RF electrode 122 are embedded in the ceramic substrate 112 so as to be parallel to the wafer placement surface 112a. The first RF electrode 121 and the second RF electrode 122 in this order are arranged in increasing order of the distance from the wafer placement surface 112a. A plurality of irregularities (not illustrated) are formed by embossing in the wafer placement surface 112a. A gas for thermal conduction (for example, an He gas) is supplied, through a gas supply path (not illustrated), from the rear surface 112b side to spaces between recessed portions provided in the wafer placement surface 112a and the wafer placed on the wafer placement surface 112a.

The first RF electrode 121 is a disc electrode that is concentric with the ceramic substrate 112 and provided such that the first RF electrode 121 faces the wafer placement surface 112a. The first RF electrode 121 is an electrode the main component of which is Mo, Nb, W, or Ta, a carbide of one of Mo, Nb, W, and Ta, or a high melting composite metal that includes two or more of Mo, Nb, W, and Ta. The first RF electrode 121 is formed of a metal mesh, a punching metal, or a metal plate. The RF voltage is applied between the first RF electrode 121 and an upper electrode (not illustrated) in generating plasma in a space above a central region of the wafer placed on the wafer placement surface 112a. The first RF electrode 121 is connected to a power supply rod 121a inserted into the rear surface 112b of the ceramic substrate 112.

The second RF electrode 122 is an annular electrode that has a larger outer diameter than that of the first RF electrode 121 and that is concentric with the ceramic substrate 112. The second RF electrode 122 is formed of a metal mesh, a punching metal, or a metal plate the material of which is the same as that of the first RF electrode 121. The second RF electrode 122 is provided such that the first RF electrode 121 and the second RF electrode 122 overlap each other in plan view. The RF voltage is applied between the second RF electrode 122 and an upper electrode (not illustrated) in generating plasma in a space above a peripheral region of the wafer placed on the wafer placement surface 112a.

The conductor units 130 are members that electrically connect the first RF electrode 121 and the second RF electrode 122 to each other. A plurality of the conductor units 130 are provided at positions where the first RF electrode 121 and the second RF electrode 122 overlap each other in plan view. Here, as illustrated in FIG. 7, the plurality of (herein, eight) conductor units 130 are provided at regular intervals in the circumferential direction of the wafer placement table 10. Each conductor unit 130 is a transversely placed coil. The conductor unit 130 is provided such that the axis of the coil extends along an arc (herein, the arc is concentric with the second RF electrode 122). The coil is formed of the same material as that of the first RF electrode 121. It is preferable that the wire diameter of the coil be smaller than or equal to 0.6 mm. The coil has an oval shape as illustrated in FIG. 8. The short diameter of the coil is coincident with the distance between the first RF electrode 121 and the second RF electrode 122.

Since the example of the manufacture and the example of usage of the wafer placement table 110 are pursuant to the example of the manufacture and the example of usage of the wafer placement table 10, description of these is omitted herein.

Here, correspondences between the elements of the present embodiment and the elements of the present invention are clarified. The ceramic substrate 112, the first RF electrode 121, the second RF electrode 122, and the conductor unit 130 according to the present embodiment respectively correspond to the ceramic substrate, the first conductive layer, the second conductive layer, and the conductor unit according to the present invention.

In the wafer placement table 110 described above, each conductor unit 130 is a transversely placed coil. Accordingly, a conductive path of the conductor unit 130 is closer to the distance between the first RF electrode 121 and the second RF electrode 122 than that in the case where a metal mesh bent in a zigzag pattern or a vertically placed coil is used as the conductor unit. Specifically, the conductive path of the conductor unit 130 is a substantially oval path (see two-dot chain line illustrated in FIG. 10). Accordingly, heat generation at the conductor unit 130 can be suppressed, which in turn can improve thermal uniformity of the wafer.

Furthermore, the same ceramic material as that of the ceramic substrate 112 is contained in an inner space of the coil included in the conductor unit 130. Thus, the variation of the density of the ceramic substrate 112 reduces, and the strength of the ceramic substrate 112 increases.

Furthermore, the coil included in the conductor unit 130 is an oval coil. When forces in the compressing direction are applied to a transversely placed circular or oval coil from above and below in the manufacturing process, the coil absorbs the forces and becomes oval.

Furthermore, the second RF electrode 122 is an annular conductive layer that overlaps the first RF electrode 121 in plan view. The axis of the coil included in the conductor unit 130 extends along an arc that is concentric with the annular second RF electrode 122. Accordingly, the length of the transversely placed coil can be comparatively increased, and the likelihood of ensuring electrical continuity between the first RF electrode 121 and the second RF electrode 122 increases.

Of course, the present invention is not in any way limited to the above-described embodiment, and the present invention can be carried out in a variety of forms as long as the forms belong to the technical scope of the present invention.

Figure 11:
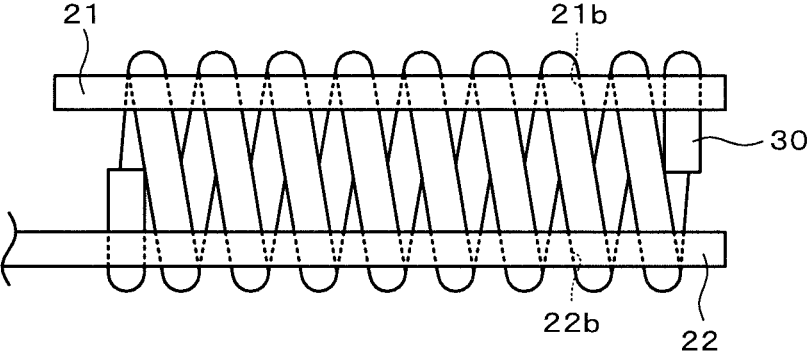
FIG. 11 is an explanatory view illustrating a variant of a first embodiment.

In the above-described first embodiment, as illustrated in FIG. 11, holes 21b that penetrate through the sub-RF electrode 21 in the thickness direction may be provided in the sub-RF electrode 21 serving as the first conductive layer, and holes 22b that penetrate through the jumper layer 22 in the thickness direction may be provided in the jumper layer 22 serving as the second conductive layer. In this case, the coil included in the conductor unit 30 is inserted through these holes 21b and 22b, thereby to cause a side surface of the coil and inner surfaces of holes 21b and 22b to be in contact with each other. In this way, compared to a case where the coil included in the conductor unit 30 is in point contact with the sub-RF electrode 21 and the jumper layer 22, the contact area increases, and accordingly, the likelihood of ensuring electrical continuity increases. The hole may be provided in one of the sub-RF electrode 21 and the jumper layer 22. Furthermore, such holes may be provided in the second embodiment.

Figure 12:
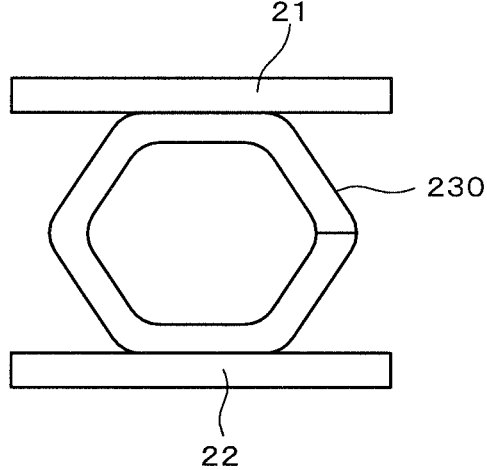
FIG. 12 is an explanatory view illustrating a variant of the first embodiment.

Although the oval coil is used according to the first and second embodiments described above, a circular coil or a polygonal coil may be used. In the case where a polygonal coil is used, it is preferable that at least one of the angles of the polygon be disposed between the first conductive layer and the second conductive layer, and it is more preferable that two or more of the angles of the polygon be disposed between the first conductive layer and the second conductive layer. FIG. 12 is an example in which a hexagonal coil is used as a conductor unit 230 in the first embodiment. Referring to FIG. 12, two of the angles are disposed between the sub-RF electrode 21 (first conductive layer) and the jumper layer 22 (second conductive layer).

Figure 13:
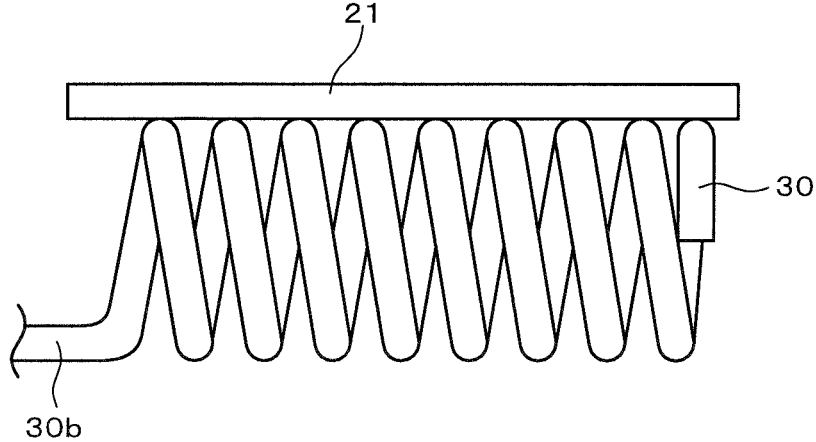
FIG. 13 is an explanatory view illustrating a variant of the first embodiment.

Although the jumper layer 22 is used according to the above-described first embodiment, an element wire portion 30*b* formed by extending a terminating portion of the coil included in the conductor unit 30 so as to be parallel to the surface of the sub-RF electrode 21 as illustrated in FIG. 13 may be used instead of the jumper layer 22.

According to the above-described first embodiment, the annular sub-RF electrode 21 serving as the first conductive layer and the rectangular jumper layer 22 serving as the second conductive layer are connected to each other through the conductor units 130. According to the above-described second embodiment, the circular first RF electrode 121 serving as the first conductive layer and the annular second RF electrode 122 serving as the second conductive layer are connected to each other through the conductor units 130. However, the shape of the first conductive layer or the shape of the second conductive layer is not limited to the above-description. A variety of shapes may be used.

According to the above-described first embodiment, the case in which the first conductive layer is the RF electrode and the second conductive layer is the jumper layer is described as the example. However, this is not particularly limiting. For example, the first conductive layer may be an electrostatic electrode and the second conductive layer may be the jumper layer. The first conductive layer may be a heater electrode (resistance heating element) and the second conductive layer may be the jumper layer. Furthermore, according to the above-described second embodiment, the case in which both the first and second conductive layers are the RF electrodes is described as the example. However, this is not particularly limiting. For example, both the first and second conductive layers may be electrostatic electrodes or both the first and second conductive layers may be heater electrodes.

Although the ceramic molded body is fabricated by the tape forming process according to the above-described first embodiment, this is not particularly limiting. For example, a ceramic molded body formed by packing ceramic powder or a ceramic molded body fabricated by a mold casting method may be utilized. These methods may be combined.

In the above-described first and second embodiments, a step in which a known focus ring is placed may be provided at an outer peripheral portion of the upper surface of the ceramic substrate 12, 112. The focus ring has the role of stably generating plasma to the outer circumferential edge of the wafer and the role of protecting the surface of the wafer placement table.

As preferred embodiments to which the present invention is applied other than the above-described first and second embodiments, wafer placement tables 310, 410, 510, and 610 illustrated in FIGS. 14 to 17 are described as examples.

FIGS. 14A to 14E are explanatory views of the wafer placement table 310, FIG. 14A is a plan view, FIG. 14B is a sectional view taken along line E-E illustrated in FIG. 14A, and FIGS. 14C to 14E are sectional views of the wafer placement table 310 respectively horizontally cut in a first conductive layer 321, a conductor unit 330, and a second conductive layer 322. The wafer placement table 310 is a monopolar-type electrostatic chuck and includes a ceramic substrate 312 having a wafer placement surface 312*a*. The ceramic substrate 312 has a disc shape and is provided with a step surface 312*b* at an outer peripheral portion of an upper surface. The first conductive layer 321 is a circular electrostatic electrode embedded in the ceramic substrate 312. A power supply rod 321*a* is connected to the center of a lower surface of the first conductive layer 321. The second conductive layer 322 is an annular electrostatic electrode embedded at a different level from the level at which the first conductive layer 321 is embedded. The conductor unit 330 is a transversely placed coil which has a circular shape in section (or an oval shape in section) and which establishes electrical continuity between the first conductive layer 321 and the second conductive layer 322. The conductor unit 330 is a ring-shaped member formed by connecting the coil in an endless manner and provided so as to be concentric with the second conductive layer 322. When a direct-current power is supplied to the power supply rod 321*a* of the wafer placement table 310, the direct-current power is applied to both the first conductive layer 321 and the second conductive layer 322.

FIGS. 15A to 15E are explanatory views of the wafer placement table 410, FIG. 15A is a plan view, FIG. 15B is a sectional view taken along line F-F illustrated in FIG. 15A, and FIGS. 15C to 15E are sectional views of the wafer placement table 410 respectively horizontally cut in first conductive layers 421 and 423, conductor units 430 and 432, and second conductive layers 422 and 424. The wafer placement table 410 is a bipolar-type electrostatic chuck and includes a ceramic substrate 412 having a wafer placement surface 412*a*. The ceramic substrate 412 has a disc shape and is provided with a step surface 412*b* at an outer peripheral portion of an upper surface. The first conductive layers 421 and 423 are semi-circular (sector-shaped) electrostatic electrodes embedded so as to be kept separated from each other in the ceramic substrate 412. A power supply rod 421*a* is connected to a lower surface of the first conductive layer 421, and a power supply rod 423*a* is connected to a lower surface of the first conductive layer 423. The second conductive layer 422 and 424 are semi-circular (sector-shaped) electrostatic electrodes embedded so as to be kept separated from each other at a different level from the level at which the first conductive layers 421 and 423 are embedded. The conductor unit 430 is a transversely placed coil and establishes electrical continuity between the first conductive layer 421 and the second conductive layer 422. The conductor unit 432 is a transversely placed coil and establishes electrical continuity between the first conductive layer 423 and the second conductive layer 424. The conductor units 430 and 432 are coils each of which has a circular shape in section (or an oval shape in section) and the axis of each of which arches. The conductor units 430 and 432 are provided so as to be respectively concentric with the second conductive layers 422 and 424. When a positive pole and a negative pole are respectively connected to the power supply rod 421*a* and the power supply rod 423*a* of the wafer placement table 410, the first conductive layer 421 and the second conductive layer 422 become the positive pole and the first conductive layer 423 and the second conductive layer 424 become the negative pole.

FIGS. 16A to 16E are explanatory views of the wafer placement table 510, FIG. 16A is a plan view, FIG. 16B is a sectional view taken along line G-G illustrated in FIG. 16A, and FIGS. 16C to 16E are sectional views of the wafer placement table 510 respectively horizontally cut in interdigital electrodes 521 and 523, a conductor unit 530, and a conductive layer 522. The wafer placement table 510 is a bipolar-type electrostatic chuck and includes a ceramic substrate 512 having a wafer placement surface 512*a*. The ceramic substrate 512 has a disc shape and is provided with a step surface 512*b* at an outer peripheral portion of an upper surface. The bipolar interdigital electrodes 521 and 523 are a pair of electrostatic electrodes embedded so as to be kept separated from each other in the ceramic substrate 512. A power supply rod 521*a* is connected to a lower surface of the interdigital electrode 521, and a power supply rod 523*a* is connected to a lower surface of the interdigital electrode 523. The conductive layer 522 is an annular electrostatic electrode embedded at a different level from the level at which the interdigital electrodes 521 and 523 are embedded. The conductor unit 530 is a transversely placed coil and establishes electrical continuity between the interdigital electrode 521 (first conductive layer) and the conductive layer 522 (second conductive layer). The conductor unit 530 is a coil which has a circular shape in section (or an oval shape in section) and the axis of which arches. The conductor unit 530 is provided so as to be concentric with the conductive layer 522. When a positive pole and a negative pole are respectively connected to the power supply rod 521*a* and the power supply rod 523*a* of the wafer placement table 510, the interdigital electrode 521 and the conductive layer 522 become the positive pole and the interdigital electrode 523 becomes the negative pole.

FIGS. 17A to 17E are explanatory views of the wafer placement table 610, FIG. 17A is a plan view, FIG. 17B is a sectional view taken along line H-H illustrated in FIG. 17A, and FIGS. 17C to 17E are sectional views of the wafer placement table 610 respectively horizontally cut in upper conductive layers 621 and 623, conductor units 630 and 632, and a lower conductive layer 622. The wafer placement table 610 is a bipolar-type electrostatic chuck and includes a ceramic substrate 612 having a wafer placement surface 612*a*. The ceramic substrate 612 has a disc shape and is provided with a step surface 612*b* at an outer peripheral portion of an upper surface. The upper conductive layers 621 and 623 are electrostatic electrodes embedded so as to be kept separated from each other in the ceramic substrate 612. The upper conductive layer 621 has an annular shape, and the upper conductive layer 623 has a circular shape. A power supply rod 623*a* is connected to a lower surface of the circular upper conductive layer 623. The lower conductive layer 622 is an annular electrostatic electrode embedded at a different level from the level at which the upper conductive layers 621 and 623 are embedded. A power supply rod 622*a* is connected to a lower surface of the lower conductive layer 622. Two conductor units 630 and 632 are transversely placed coils and establish electrical continuity between the annular upper conductive layer 621 (first conductive layer) and the circular lower conductive layer 622 (second conductive layer). The conductor unit 630 is a coil which has a circular shape in section (or an oval shape in section) and the axis of which arches. The conductor unit 630 is provided so as to be concentric with the lower conductive layer 622. When a positive pole and a negative pole are respectively connected to the power supply rod 622*a* and the power supply rod 623*a* of the wafer placement table 610, the upper conductive layer 621 and the lower conductive layer 622 become the positive pole and the upper conductive layer 623 becomes the negative pole.

Figure 18:
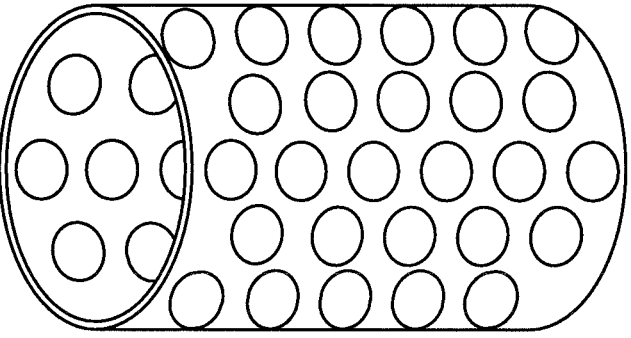
FIG. 18 is a perspective view of a punching-metal cylindrical body.

Although the transversely placed coil is used as the conductor unit according to the above-described first and second embodiments and the embodiments illustrated in FIGS. 14 to 17, a transversely placed perforated cylindrical body may be used as the conductor unit. The perforated cylindrical body has holes provided in a side surface of a conductive cylindrical body. Examples of the perforated cylindrical body include, for example, a punching-metal cylindrical body (see FIG. 18), a metal-mesh cylindrical body, and the like. The material of the ceramic substrate can enter the inside of the perforated cylindrical body through the holes in the side surface. As is the case with the coil, a material the main component of which is Mo, Nb, W, or Ta, a carbide of one of Mo, Nb, W, and Ta, or a high melting composite metal that includes two or more of Mo, Nb, W, and Ta can be applied to the material of the perforated cylindrical body. Even when the transversely placed perforated cylindrical body is used instead of the transversely placed coil, similar effects to those obtained with the coil can be obtained.

The present application claims priority from Japanese Patent Application No. 2021-201834, filed on Dec. 13, 2021, the entire contents of which are incorporated herein by reference.

What is claimed is:

1. A wafer placement table, comprising:
a ceramic substrate having a wafer placement surface;
a first conductive layer and a second conductive layer that are embedded at different levels in the ceramic substrate; and
a conductor unit that establishes electrical continuity between the first conductive layer and the second conductive layer, wherein
the conductor unit is a transversely placed coil or a transversely placed perforated cylindrical hollow body;
wherein a material of the ceramic substrate is contained in an inner space of the conductor unit; and
wherein an inner space of the conductor unit is filled with material of the ceramic substrate.

2. The wafer placement table according to claim 1, wherein
a sectional shape of the conductor unit is a circle or an oval.

3. The wafer placement table according to claim 1, wherein
the conductor unit is the coil, wherein
at least one of the first conductive layer or the second conductive layer has a hole that penetrates therethrough in a thickness direction, and wherein
the coil is inserted through the hole so as to allow an inner surface of the hole and a side surface of the coil to be in contact with each other.

4. The wafer placement table according to claim 1, wherein
the second conductive layer is a linear conductive layer or a rectangular conductive layer that intersects the first conductive layer in plan view, and wherein
an axis of the conductor unit straightly extends in a direction in which the second conductive layer extends.

5. The wafer placement table according to claim 1, wherein the second conductive layer is an annular conductive layer or a sector-shaped conductive layer that overlaps the first conductive layer in plan view, and wherein an axis of the conductor unit extends along an arc that is concentric with the second conductive layer.

6. The wafer placement table according to claim 5, wherein the wafer placement table has a plurality of conductor units that are provided at regular intervals in a circumferential direction of the ceramic substrate.

\* \* \* \* \*